(12) United States Patent
Nagami

(10) Patent No.: US 9,595,641 B2
(45) Date of Patent: Mar. 14, 2017

(54) LIQUID CRYSTAL DISPLAY DEVICE

(71) Applicant: Japan Display Inc., Mobara-shi, Chiba (JP)

(72) Inventor: Takahiro Nagami, Mobara (JP)

(73) Assignee: Japan Display Inc., Tokyo (JP)

( * ) Notice: Subject to any disclaimer, the term of this patent is extended or adjusted under 35 U.S.C. 154(b) by 137 days.

(21) Appl. No.: 13/849,566

(22) Filed: Mar. 25, 2013

(65) Prior Publication Data

US 2013/0264573 A1    Oct. 10, 2013

(30) Foreign Application Priority Data

Apr. 10, 2012    (JP) .................................. 2012-088869

(51) Int. Cl.
   H01L 33/36    (2010.01)
   G02F 1/1345    (2006.01)
   H01L 33/42    (2010.01)

(52) U.S. Cl.
   CPC .......... H01L 33/42 (2013.01); G02F 1/13458 (2013.01)

(58) Field of Classification Search
   None
   See application file for complete search history.

(56) References Cited

U.S. PATENT DOCUMENTS

2010/0289997 A1* 11/2010 Suzuki ........................ 349/158
2011/0084268 A1*  4/2011 Yamazaki et al. .............. 257/43

FOREIGN PATENT DOCUMENTS

CN    101576693 A  * 11/2009
JP    2004-361443    12/2004

OTHER PUBLICATIONS

Fu et al., English Translation of CN 101576693 A, Nov. 11, 2009.*
"Terminal." Merriam-Webster.com. Merriam-Webster, n.d. Web. Apr. 17, 2016.*

* cited by examiner

*Primary Examiner* — Whitney T Moore
*Assistant Examiner* — Scott R Wilson
(74) *Attorney, Agent, or Firm* — Typha IP LLC

(57) ABSTRACT

A liquid crystal display device includes a terminal in which a first insulating film and a second insulating film are formed on a terminal metal, a contact hole is formed on the first insulating film and the second insulating film, and a first ITO is formed on the contact hole and the second insulating film. The terminal is connected to a different circuit through an ACF including conductive particles. The contact hole includes a region in which a second ITO is stacked on the first insulating film and the first ITO is stacked on the second ITO in the contact hole. A width s of a portion where the terminal metal contacts the first ITO in the contact hole is s<d, where the diameter of the conductive particle is d.

3 Claims, 14 Drawing Sheets

LIQUID CRYSTAL DISPLAY DEVICE

CLAIM OF PRIORITY

The present application claims priority from Japanese Patent Application JP 2012-088869 filed on Apr. 10, 2012, the content of which is hereby incorporated by reference into this application.

BACKGROUND OF THE INVENTION

1. Field of the Invention

The present invention relates to a liquid crystal display device, and more particularly to a liquid crystal display device that improves the reliability of connection of a terminal portion.

2. Description of the Related Art

A liquid crystal display device includes a TFT substrate on which pixel electrodes, thin film transistors (TFT), and the like are formed in a matrix arrangement and a counter substrate on which a black matrix, an overcoat film, or the like is formed at locations as matched with the pixel electrodes on the TFT substrate as the counter substrate is opposite to the TFT substrate, and liquid crystals are sandwiched between the TFT substrate and the counter substrate. Images are formed by controlling the optical transmittance of liquid crystal molecules for each pixel.

Since the liquid crystal display device is flat and light-weighted, the applications of the liquid crystal display device are widely spread in various fields from large-sized display devices such as a TV set to a mobile telephone, a DSC (Digital Still Camera), and the like. On the other hand, the viewing angle characteristics cause a problem in the liquid crystal display device. A viewing angle characteristic is a phenomenon in which brightness is changed or chromaticity is changed between the case where a screen is seen from the front and the case where the screen is seen from an oblique direction. For the viewing angle characteristic, an IPS (In Plane Switching) mode exhibits excellent characteristics, in which liquid crystal molecules are operated by a horizontal electric field.

A liquid crystal display panel formed of a TFT substrate and a counter substrate is supplied with a scan signal, a picture signal, a common voltage, and so on from terminal portions formed on the TFT substrate. Lead lines connected to scanning lines, picture signal lines, common interconnections, and so on extend on the terminal portions, and these interconnections are formed of metals. The interconnections are protected by a gate insulating film, an inorganic passivation film, and so on. In the terminal portion, a contact hole is formed for connecting to a flexible wiring board or the like, and a metal film is exposed.

Since the metal film is corroded with moisture or the like, or oxidized with oxygen to be an insulator, the metal film is protected by covering the metal film with ITO (Indium Tin Oxide), for example, which is a conductive metal oxide, in order to prevent these events.

However, the resistance between ITO and the metal film is increased depending on manufacture conditions or use conditions for possibly causing conduction failure. Japanese Patent Application Laid-Open Publication No. 2004-361443 describes a configuration in which ITO is not used on a connecting portion between a terminal metal and an external terminal of a flexible wiring board or the like and an insulating film such as silicon oxide or silicon nitride is formed on the terminal metal, and a plurality of contact holes are formed on the insulating film for connection to the external terminals. In Japanese Patent Application Laid-Open Publication No. 2004-361443, a terminal portion is connected to a flexible wiring board or the like using an ACF (Anisotropic Conductive Film) by thermocompression bonding of the ACF.

SUMMARY OF THE INVENTION

On a portion where a metal interconnection extending from a lead line from a display region forms a terminal portion, insulating films such as a gate insulating film and an inorganic passivation film are removed, and a contact hole is formed on the films. In order to protect the metal film of the terminal portion, the metal of the terminal portion is covered with a conductive metal oxide film such as ITO. When flaws or cracks occur on the metal oxide, moisture or oxygen enters from the flaws or cracks to cause the metal film to be corroded or oxidized.

Japanese Patent Application Laid-Open Publication No. 2004-361443 describes the configuration in which in order to prevent the occurrence of connection failure caused by insulating impurities formed between ITO and the metal film, a plurality of contact holes are formed on the insulating film for securing connection. The configuration causes a problem. When it takes a long time to connect the terminal portions to an external circuit after forming the contact holes, a problem arises in that the exposed metal film is oxidized or corroded in the portions of the contact holes, although it is fine when an external circuit such as a flexible wiring board is connected immediately after forming a plurality of the contact holes on the insulating film of the terminal portions.

On the other hand, in the case where the metal film of the terminal portion is covered with ITO or the like as in conventional techniques, such a problem arises in that when ITO or the like has defects and moisture or oxygen enters the metal film in a lower layer, the metal film is corroded or oxidized to increase the resistance of the terminal portion.

Such a method is performed for connecting terminal portions to an external circuit such as a flexible wiring board, in which an ACF is sandwiched between the terminals and the external terminals of the flexible wiring board, for example, for connecting the terminals to the external terminals by thermocompression bonding. The ACF is formed of a resin film and conductive particles having a diameter of 3 to 5 μm and dispersed in the resin film. When the ACF is thermocompression-bonded between the terminals and the external terminals of the external circuit, the conductive particles connect the terminals to the external terminals.

The conductive particle is a particle that metal plating is applied to a plastic particle. Since the conductive particle is pressed against the terminal portion with heat in the thermocompression bonding of the ACF, flaws are prone to occur on ITO and the metal film below ITO in the terminal portion. When flaws occur on ITO and the metal film, the metal film or the like is corroded or oxidized in the flaws to cause conduction failure. Such a problem is a problem on the portions connected to the external terminals of a flexible wiring board, for example, as well as a problem on the terminal portions connected to a driver IC or the like.

FIG. 14 is a plan view of a terminal structure and a terminal array in a conventional example. In FIG. 14, terminals are arranged in a so-called staggered arrangement. Such a terminal arrangement is often used for terminals connected to an IC driver. In FIG. 14, a gate lead line 1011 extends from a display region, and the gate lead line 1101 is widened at a terminal portion 120 to form a terminal metal 1012.

On the terminal metal 1012, a contact hole 121 is formed on a protection insulating film such as a gate insulating film or an inorganic passivation film. ITO 1081 is formed simultaneously as a common electrode or the like is formed. The ITO 1081 covers the contact hole 121 and a portion around the contact hole 121 for protecting a terminal metal 1012 from an external atmosphere.

FIG. 15 is a cross sectional view along a line D-D in FIG. 14. In FIG. 15, the terminal metal 1012 exists on a TFT substrate. The terminal metal 1012 is formed of the widened gate lead line 1011. The gate lead line 1011 is protected by a gate insulating film 102 formed of $SiO_2$, SiN, or the like and an inorganic passivation film 106 formed of SiN or the like. However, the contact hole 121 is formed by removing the insulating films for conducting electricity in the terminal portion 120. The contact hole 121 and the portion around the contact hole 121 are covered with the ITO 1081.

In FIG. 15, the terminal 120 is connected to the external circuit such as an IC through the ACF. In FIG. 15, the ACF resin film is omitted, and only a conductive particle 170 is shown. Moreover, the terminals of the IC are also omitted. In FIG. 15, the conductive particle 170 exists in the contact hole 121 to conduct electricity to the ITO 1081 formed on the terminal metal 1012. The conductive particle 170 is bonded to the terminal portion 120 together with a resin by thermocompression bonding. However, the conductive particle 170 often causes flaws on the ITO 1081 or the terminal metal 1012 in compression bonding. When such flaws occur, the terminal metal 1012 is corroded with moisture, or oxidized with oxygen for causing conduction failure.

Such a phenomenon impairs the reliability of connection. It is an object of the present invention to prevent a phenomenon that causes flaws on ITO or a terminal metal for causing conduction failure in the case where the ACF as described above is used to connect a terminal portion to an external circuit, and to implement a highly reliable liquid crystal display device.

The present invention is to solve the problems. Main aspects are as follows.

(1) A liquid crystal display device includes a terminal formed on a TFT substrate including a terminal region and a display region on which a TFT and a pixel electrode are formed in a matrix arrangement. The terminal includes: a first insulating film and a second insulating film formed on a terminal metal formed on the terminal region; a contact hole formed on the first insulating film and the second insulating film; and a first ITO formed on the contact hole and the second insulating film. The terminal is connected to a different circuit through an ACF including a conductive particle. The contact hole includes a region in which a second ITO is stacked on the first insulating film and the first ITO is stacked on the second ITO in the contact hole. A width s of a portion where the terminal metal contacts the first ITO in the contact hole is s<d, where a diameter of the conductive particle is d.

(2) A liquid crystal display device includes a terminal formed on a TFT substrate including a terminal region and a display region on which a TFT and a pixel electrode are formed in a matrix arrangement. The terminal includes: a first insulating film, a second insulating film, and a third insulating film formed on a terminal metal formed on the terminal region; a contact hole formed on the first insulating film, the second insulating film, and the third insulating film; and a first ITO formed on the contact hole and the third insulating film. The terminal is connected to a different circuit through an ACF including a conductive particle. The contact hole includes a region in which the first insulating film, the second insulating film, and a second ITO are stacked in this order and the first ITO is stacked on the second ITO in the contact hole. A width s of a portion where the terminal metal contacts the first ITO in the contact hole is s<d, where a diameter of the conductive particle is d.

(3) A liquid crystal display device includes a terminal formed on a TFT substrate including a terminal region and a display region on which a TFT and a pixel electrode are formed in a matrix arrangement. The terminal includes: a terminal metal formed on a first insulating film on the terminal region; a second insulating film and a third insulating film formed on the terminal metal; a contact hole formed on the second insulating film and the third insulating film; and a first ITO formed on the contact hole and the third insulating film. The terminal is connected to a different circuit through an ACF including a conductive particle. The contact hole includes a region in which a second ITO is stacked on the second insulating film and the first ITO is stacked on the second ITO in the contact hole. A width s of a portion where the terminal metal contacts the first ITO in the contact hole is s<d, where a diameter of the conductive particle is d.

According to the present invention, flaws do not occur on ITO on a portion directly bonded to the metal of a terminal portion caused by the conductive particles of an ACF, so that such a phenomenon can be prevented that the metal of the terminal portion is corroded or oxidized. Accordingly, it is possible to stably secure the electrical continuity of the terminal portion, and to implement a highly reliable liquid crystal display device.

DETAILED DESCRIPTION OF THE PREFERRED EMBODIMENTS

In the following, the content of the present invention will be described in detail with reference to embodiments.

First Embodiment

Figure 1:
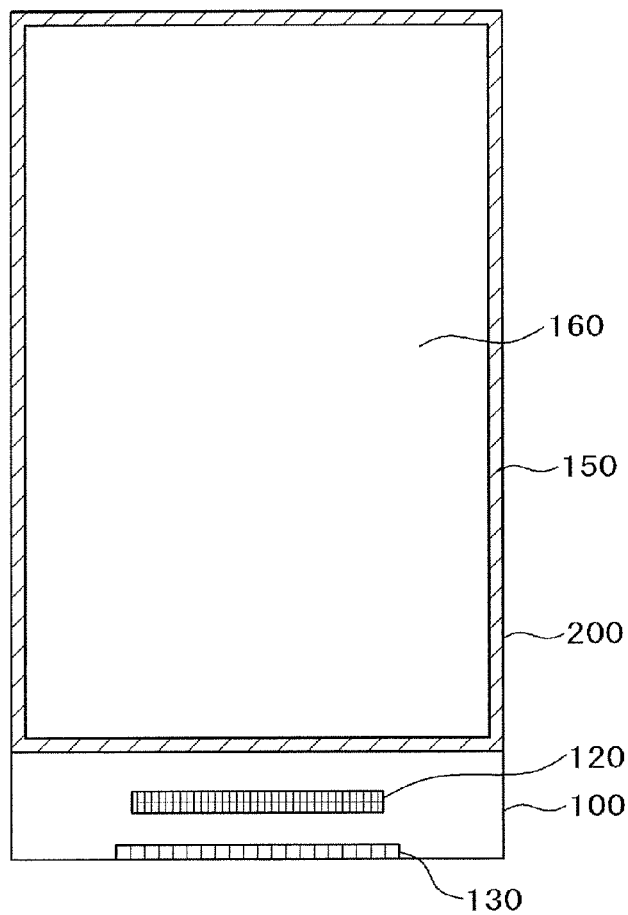
FIG. 1 is a plan view of a liquid crystal display device to which the present invention is applied.

FIG. 1 is an example of a liquid crystal display device to which the present invention is applied. FIG. 1 is a liquid crystal display device for use in a mobile telephone or the like, for example. In a display region 160 in FIG. 1, pixels including TFTs and pixel electrodes are formed in a matrix arrangement on a TFT substrate 100, and a counter substrate 200 including color filters and the like is bonded to the TFT substrate 100 through a sealing material 150. A liquid crystal layer, not shown, is sandwiched between the TFT substrate 100 and the counter electrode 200.

The TFT substrate 100 is formed larger than the counter substrate 200. A portion where the TFT substrate 100 is provided in a single substrate is a terminal region on which IC terminals 120 connected to a driver IC or the like and flexible wiring board terminals 130 connected to an external circuit, for example, are formed. Both of the IC driver terminals 120 and the flexible wiring board terminals 130 also have similar problems, and their problems can be solved by similar schemes. In the following, the IC driver terminal 120 is taken as an example for description. The description can be similarly applied to the flexible wiring board terminals 130. In the following description, the IC driver terminal 120 is simply referred to as a terminal.

Figure 2:
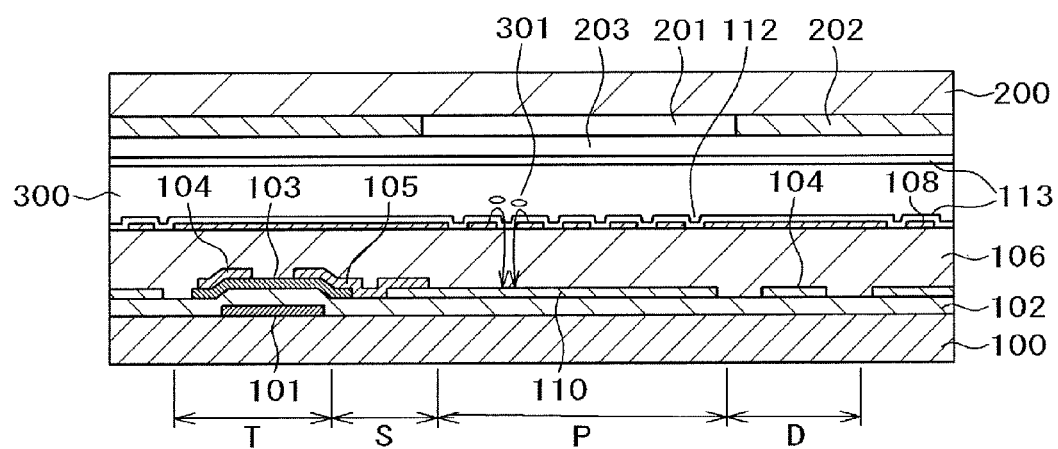
FIG. 2 is a cross sectional view of a display region according to a first embodiment.

FIG. 2 is a cross sectional view of a liquid crystal display device, which is a so-called IPS-LITE liquid crystal display device, and to which the embodiment is applied. In FIG. 2, a gate electrode 101 is formed on the glass TFT substrate 100. The gate electrode 101 has a two-layer structure for reducing electrical resistance. The lower layer is an alloy mainly made of Al, and the upper layer is an alloy mainly made of Mo. The alloy mainly made of Al is an alloy including 90% or more of an Al component, and the alloy mainly made of Mo is an alloy including 90% or more of Mo. In the embodiment, the lower layer is made of AlCu, and the upper layer is made of MoCr. For the components, for example, Cu occupies 0.5% of AlCu, and Cr occupies 2.5% of MoCr. In addition to this, an Al alloy forming the lower layer is AlNd, and a metal forming the upper layer is MoW or the like.

A material the same as the material of the gate electrode 101 is used for a gate lead line 1011 and a terminal metal 1012. AlCu and AlNd forming the terminal metal 1012 are also corroded with moisture. Therefore, when the protecting ITO includes flaws or cracks on the terminal portion 120, an Al alloy is corroded from the flaws or cracks.

A gate insulating film 102 is formed on the gate electrode 101. A semiconductor layer 103 made of a-Si is formed on the gate insulating film 102, and a drain electrode 104 and a source electrode 105 are formed on the semiconductor layer 103. A channel portion is formed between the drain electrode 104 and the source electrode 105, and a TFT is thus formed. Since this type of TFT includes the gate electrode 101 on the lower side of the semiconductor layer 103, the TFT is called a bottom gate TFT. The source electrode 105 extends in the region of a pixel electrode 110, and is connected to the pixel electrode 110 that is a transparent electrode formed of ITO. In FIG. 2, the pixel electrode 110 is formed as solidly applied in the plane.

In FIG. 2, a picture signal line 104 that is formed simultaneously with the drain electrode 104 exists between the pixel electrodes 110. The picture signal line 104, the drain electrode 104, the source electrode 105, and a drain lead line, not shown, are simultaneously formed in the same process steps. It is noted that the drain lead line is an interconnection connecting the picture signal line 104 or the drain line 104 in the display region to the terminal. The drain electrode 104, the drain lead line, and the like are formed of MoCr, MoW, an Al alloy, or the like. In the case where it is necessary to reduce the resistance of the picture signal line 104 or the like, an Al alloy is used.

An inorganic passivation film 106 is formed so as to cover the TFT, the pixel electrode 110, and so on. A common electrode 108 including a slit 112 is formed on the inorganic passivation film 106. The common electrode 108 is formed with ITO as solidly applied throughout the surface, and the slit 112 is formed on the portion opposite to the pixel electrode 110. When a picture signal is applied to the pixel electrode 110 through the TFT, electric flux lines occur between the pixel electrode 110 and the common electrode 108 through the slit 112, and liquid crystal molecules 301 are rotated to change the transmittance of a liquid crystal layer 300 for forming images. T in FIG. 1 denotes a TFT region, S denotes a source electrode region, P denotes a pixel electrode region, and D denotes a picture signal line region.

In FIG. 2, the counter substrate 200 is disposed opposite to the TFT substrate 100 as the liquid crystal layer 300 is sandwiched between the counter substrate 200 and the TFT substrate 100. A color filter 201 and a black matrix 202 are formed on the counter substrate 200, and an overcoat film 203 is formed on the color filter 201 and the black matrix 202. An alignment layer 113 is formed on the overcoat film 203. Since FIG. 2 shows an IPS liquid crystal display device, no electrodes are formed inside the counter substrate 200.

Figure 3:
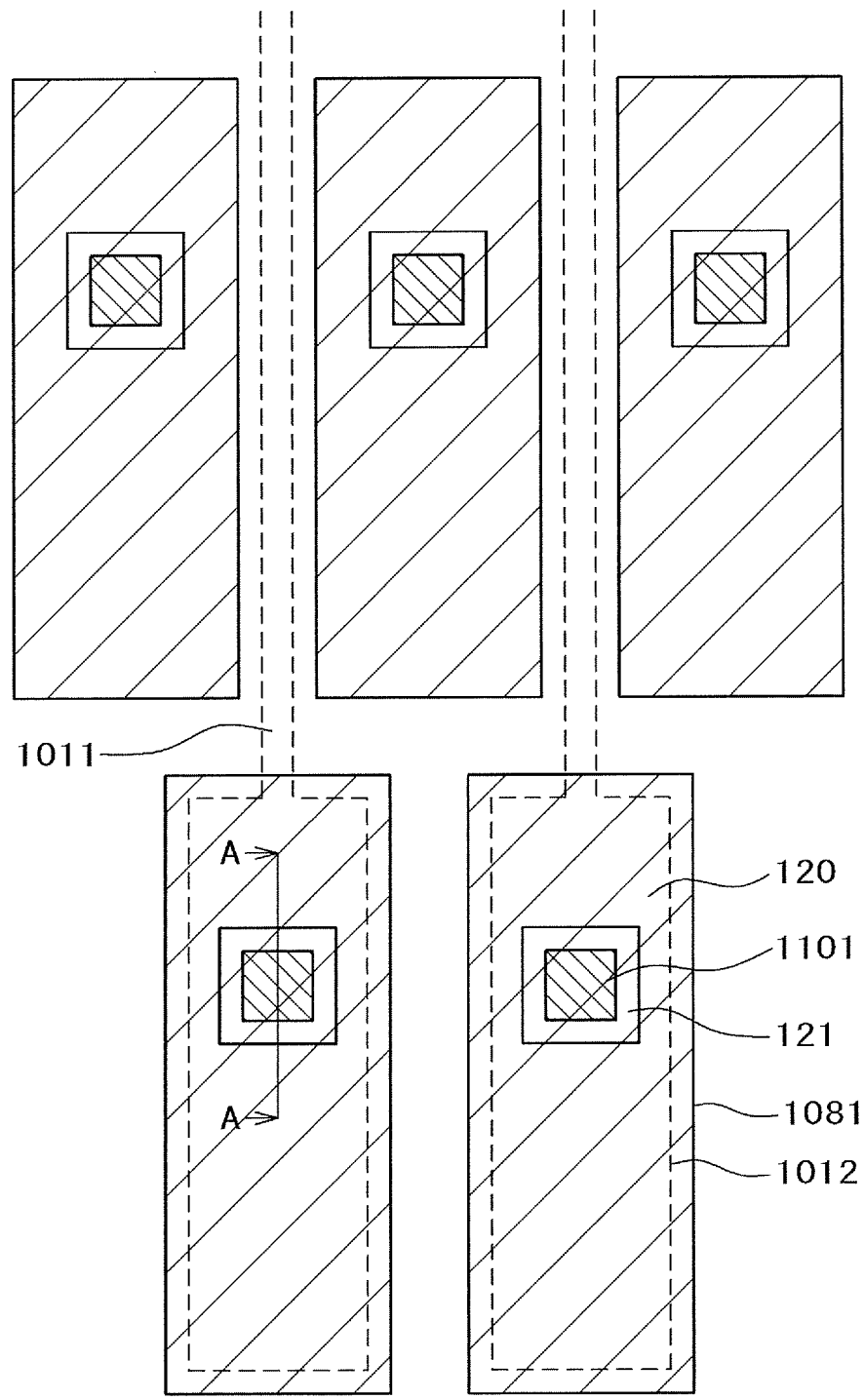
FIG. 3 is a plan view of terminal portions according to a first example of the first embodiment.

FIG. 3 is a plan view of terminal portions according to a first example of the first embodiment of the present invention. In FIG. 3, the terminals 120 are arranged in a so-called staggered arrangement. The terminal 120 includes the gate lead line 1011 extending from the display region, and the gate lead line 1011 is widened in width and forms the terminal metal 1012 in the terminal portion. The entire terminal portion is covered with ITO 1081 formed in the same process step as the process step of the common electrode 108.

Most of the terminal metal 1012 is also covered with a protective film formed of the gate insulating film 102 and the inorganic passivation film 106. A contact hole 121 is formed on a part of the terminal portion, and the IC is connected at this portion. An island region is formed in the contact hole 121, in which a pixel electrode ITO 1101 formed simultaneously with the gate insulating film 102 and the pixel electrode 110 and a common electrode ITO 1081 formed simultaneously with the common electrode are stacked on each other. This is the feature of the present invention.

Figure 4:
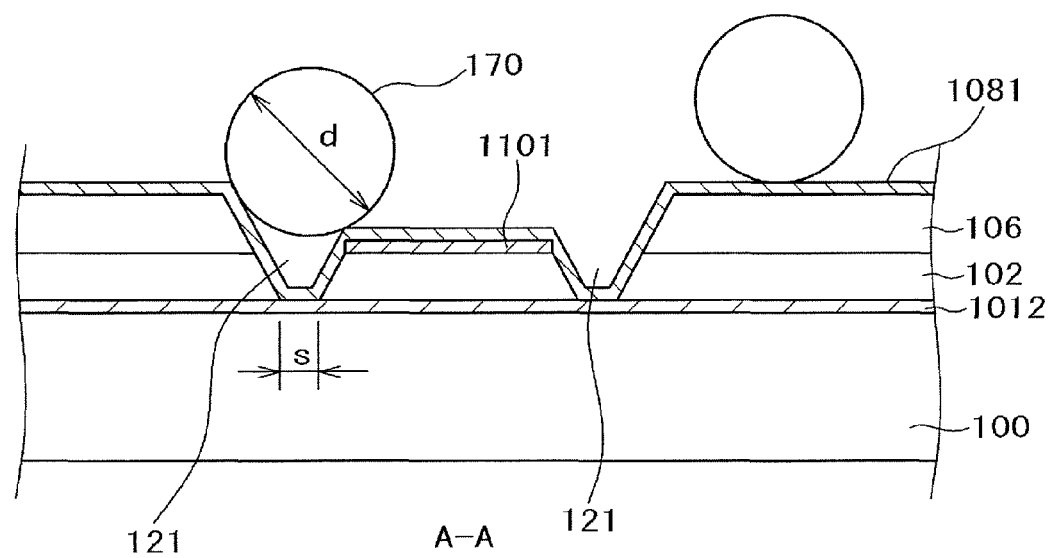
FIG. 4 is a cross sectional view along a line A-A in FIG. 3.

FIG. 4 is a cross sectional view along a line A-A in FIG. 3. In FIG. 3, the gate lead line 1011 is formed on the TFT substrate 100. The gate lead line 1011 extends from the display region, and is widened to form the terminal metal 1012. The gate insulating film 102 and the inorganic passivation film 106 are formed on the terminal metal 1012 as the inorganic passivation film 106 and the gate insulating film 102 are stacked on each other. The inorganic passivation film 106 and the gate insulating film 102 are etched together to form the contact hole 121. The common electrode ITO 1081 formed simultaneously with the common electrode 108 covers the contact hole 121 on the entire terminal portion.

In FIG. 4, the gate insulating film 102 and the pixel electrode ITO 1101 are stacked on the center part of the contact hole 121, and the common electrode ITO 1081 is formed on the pixel electrode ITO 1101. Processes for forming such a structure are as follows. Namely, when the gate insulating film 102 is formed and the pixel electrode 110 is formed with ITO on the gate insulating film 102, the pixel electrode ITO 1101 is partially left on the gate insulating film 102 on the terminal portion. After that, the inorganic passivation film 106 is formed, and the inorganic passivation film 106 and the gate insulating film 102 are etched together in order to further form the contact hole 121 on the terminal portion. At this time, the portion where the pixel electrode ITO 1101 is left becomes a resist, and the gate insulating film 102 below the pixel electrode ITO 1101 is not etched, and left in an island shape.

Thus, the portion where the common electrode ITO 1081 is actually connected to the terminal metal 1012 is only a region in a width s in FIG. 4. The region in the width s is formed so as to surround the island region in FIG. 3. In the case where an IC is connected to such a terminal portion using an ACF, conductive particles 170 dispersed in resin conduct electricity. A diameter d of the conductive particle 170 is made greater than the width s on the lower part of the contact hole 121, so that the conductive particle 70 can be prevented from contacting the bottom face of the contact hole 121.

Since the configuration as shown in FIG. 4 does not cause such an event that the conductive particle 170 presses the stacked portion of the terminal metal 1012 and the common electrode ITO 108, flaws or cracks can be prevented from occurring on the terminal metal 1012 and the ITO 1081 on the stacked portion. When the occurrence of such flaws or cracks can be prevented on the bottom face of the contact hole 121 as described above, the terminal metal 1012 can be prevented from being corroded or oxidized, and electrical connection on the terminal portion 120 can be stably secured. In this regard, since the diameter of the conductive particle 170 ranges from 3 to 5 µm, it is necessary to reduce the diameter s of the bottom part of the contact hole 121 below the diameter of the conductive particle 170.

In FIG. 4, the conductive particle 170 exists in the contact hole 121 as well as exists on the stacked film of the gate insulating film 102 and the inorganic passivation film 106. Electrical continuity to the IC using the ACF can be secured at any locations. However, on the terminal portion 120, the conductive particle 170 does not contact the portion where the terminal metal 1012 and the common electrode ITO 1081 are directly stacked on each other.

Figure 5:
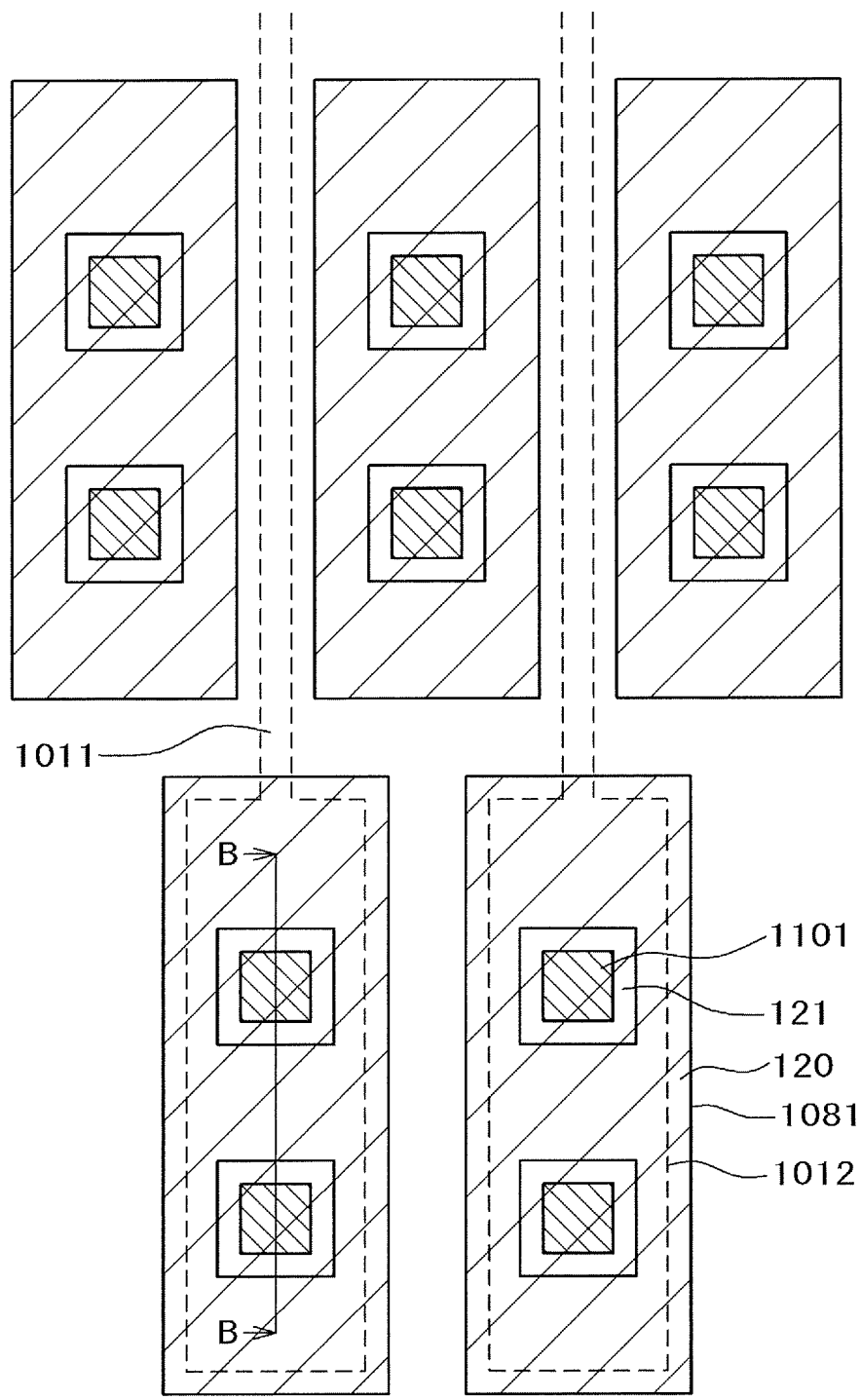
FIG. 5 is a plan view of terminal portions according to a second example of the first embodiment.
Figure 6:
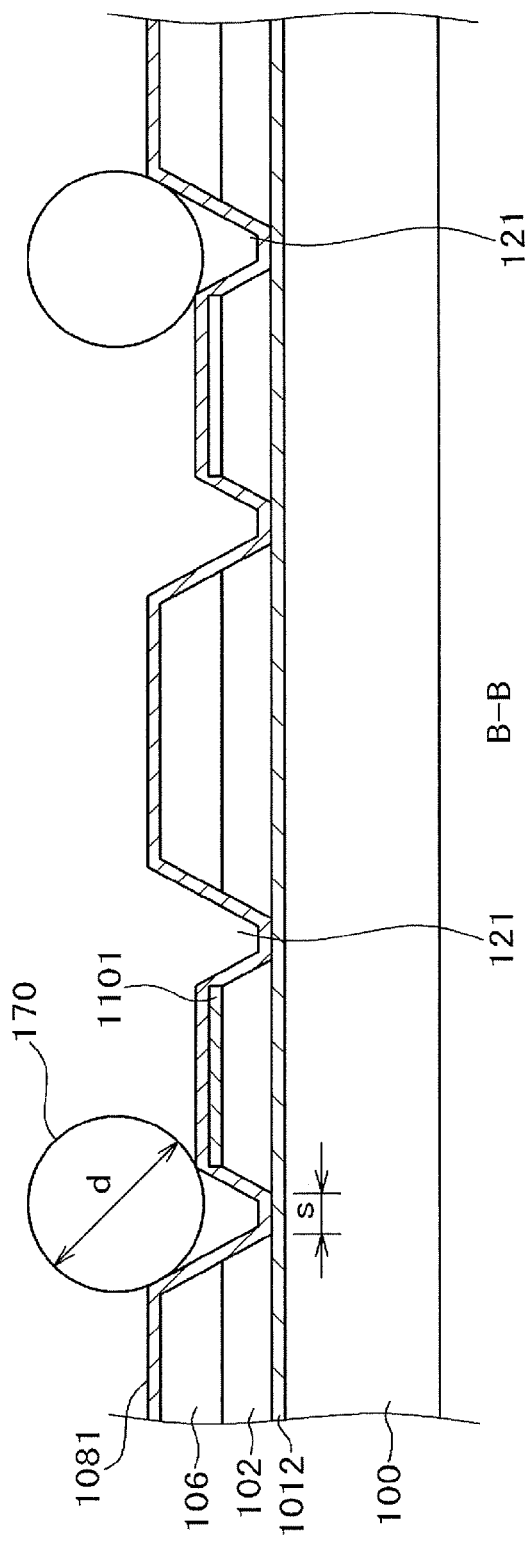
FIG. 6 is a cross sectional view along a line B-B in FIG. 5.

FIGS. 5 and 6 are diagrams of a second example of the embodiment. FIG. 5 is a plan view, and FIG. 6 is a cross sectional view. In FIG. 5, the terminal portion 120 is the same as the first example in FIG. 3, except that two contact holes 121 including an island region are formed. In FIG. 5, two contact holes 121 including an island region inside the contact holes 121 are formed in parallel with each other in the vertical direction. The contact holes 121 work the same.

FIG. 6 is a cross sectional view along a line B-B in FIG. 5. In FIG. 5, two contact holes 121 including an island portion on the center are formed in parallel with each other. The island portion is a portion where the pixel electrode ITO 1101 is formed on the gate insulating film 102 as similar to FIG. 4. Although a forming method is the same as the method described in the first example, only the difference is in that the pixel electrode ITO 1101 is formed at two locations on the terminal portion 120. Therefore, the configuration is different from the configuration in FIG. 4 in that a photomask when forming the pixel electrode 110 is different, and the processes are the same.

FIG. 6 shows the state in which the conductive particle 170 exists on the portion of the contact hole 121. Since the diameter s of the bottom face of the contact hole 121 is smaller than the diameter d of the conductive particle 170, the conductive particle 170 does not contact the bottom face of the contact hole 121. Therefore, the conductive particle 170 does not cause flaws or cracks on the ITO 1081 or the terminal metal 1012 on the portion where the common electrode ITO 1081 and the terminal metal 1012 are stacked on each other on the bottom face of the contact hole 121.

The example has a feature that the contact resistance of the terminal portion 120 can be made smaller because the contact hole 121 is formed at two locations. FIGS. 5 and 6 illustrate an example that the contact hole 121 is formed at two locations. However, two or more of the contact holes 121 can be formed depending on the size of the terminal portion 120.

Figure 7:
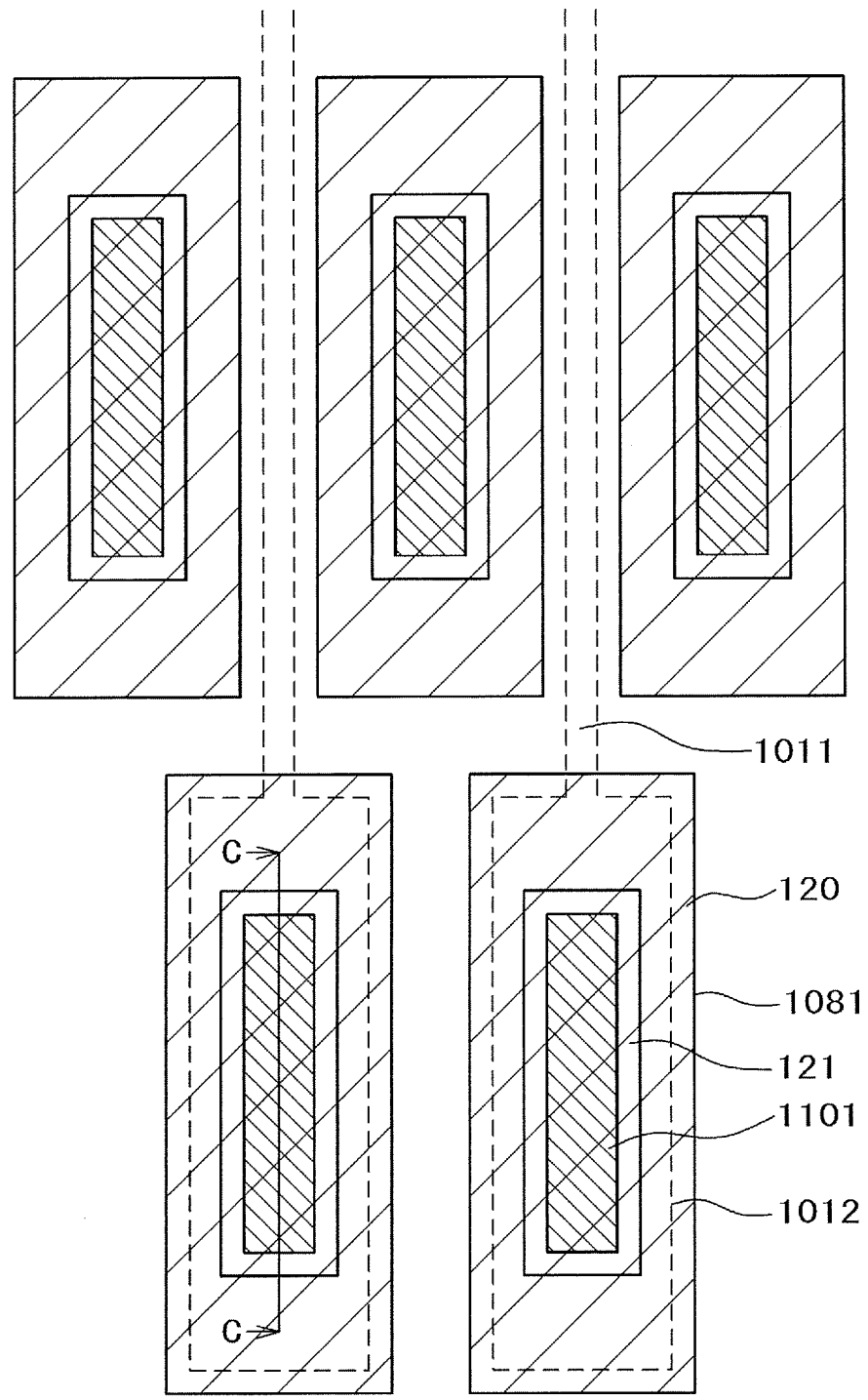
FIG. 7 is a plan view of terminal portions according to a third example of the first embodiment.
Figure 8:
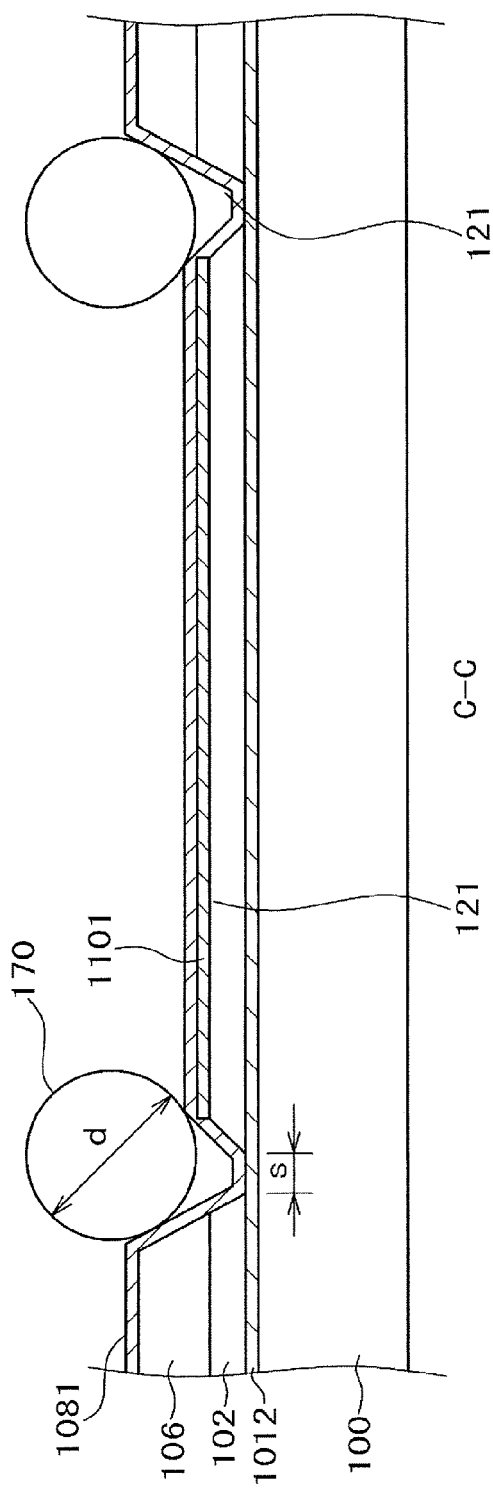
FIG. 8 is a cross sectional view along a line C-C in FIG. 7.

FIGS. 7 and 8 are diagrams of a third example of the embodiment. FIG. 7 is a plan view, and FIG. 8 is a cross sectional view. In FIG. 7, the fact that a contact hole 121 including an island region is formed on the terminal portion 120 is the same as the first example. However, as compared with FIG. 3 showing the first example, the diameter of the contact hole 121 is large, and the island region formed inside the contact hole 121 is also large. The other configurations are the same as the configurations in FIG. 3, and the contact hole 121 works in the same way.

FIG. 8 is a cross sectional view along a line C-C in FIG. 7. In FIG. 8, a tall contact hole 121 including a tall island portion on the center is formed. The island portion is a portion where the pixel electrode ITO 1101 is formed on the gate insulating film 102 as similar to FIG. 4. A forming method is the same as the method described in the first example.

FIG. 8 shows the state in which the conductive particle 170 exists on the portion of the contact hole 121. Since the diameter s of the bottom face of the contact hole 121 is smaller than the diameter d of the conductive particle 170, the conductive particle 170 does not contact the bottom face of the contact hole 121. Therefore, the conductive particle 170 does not cause flaws or cracks on the ITO 1081 or the terminal metal 1012 on the portion where the common electrode ITO 1081 and the terminal metal 1012 are stacked on each other on the bottom face of the contact hole 121.

As shown in FIG. 7, the example has a feature that the contact resistance of the terminal portion can be made smaller because the length of the contact hole 121 surrounding the tall island region is longer than the case of the first example in FIG. 3.

Second Embodiment

Figure 9:
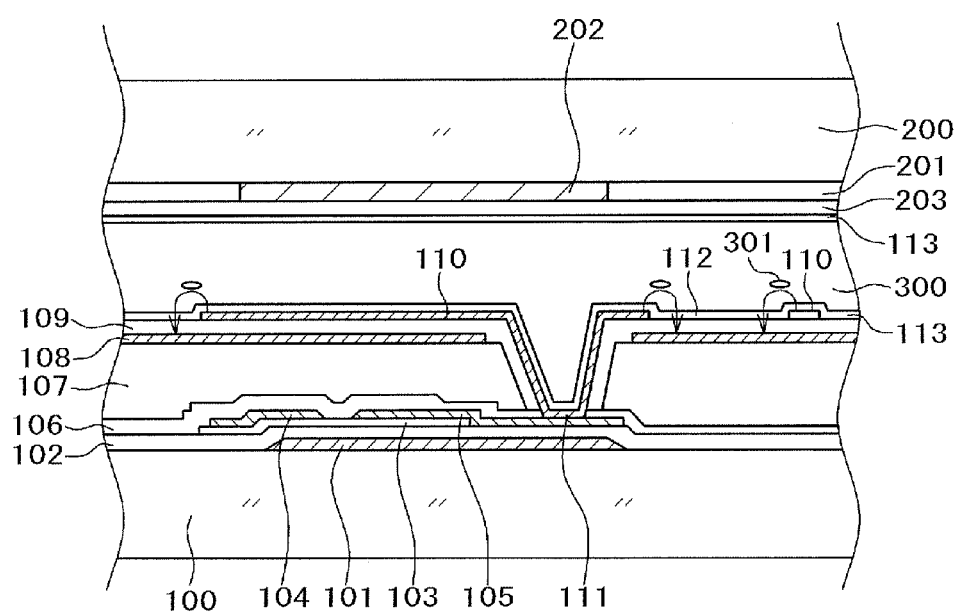
FIG. 9 is a cross sectional view of a display region according to a second embodiment.

The first embodiment is an example that the present invention is applied to the terminal portion of an IPS liquid crystal display device, which is a so-called IPS-LITE liquid crystal display device. The present invention is applicable not only to the liquid crystal display device according to the IPS-LITE mode but also to liquid crystal display devices according to other IPS modes, a liquid crystal display device according to IPS PRO, for example. FIG. 9 is a cross sectional view of the display region of a liquid crystal display device according to an IPS mode called IPS PRO.

Briefly, in a structure in FIG. 9, a comb tooth pixel electrode 110 is formed on a common electrode 108 formed in a solid plane as an insulating film 109 is sandwiched between the tooth pixel electrode 110 and the common electrode 108. A voltage is then applied across the pixel electrode 110 and the common electrode 108 to rotate liquid crystal molecules 301, and the optical transmittance of a liquid crystal layer 300 is controlled for each pixel, so that images are formed.

In FIG. 9, a gate electrode 101 is formed on a TFT substrate 100 made of glass. The gate electrode 101 is formed simultaneously when forming a scanning line, a gate lead line 1011, or a terminal metal 1012. The gate electrode 101 includes an Mo alloy, which is a cap layer, stacked on an Al alloy layer. For the Al alloy layer, an AlNd alloy, an AlCu alloy, or the like is used. For the Mo alloy, MoCr or MOW or the like is used. The gate electrode 101 extends near the end of the TFT substrate 100, and forms the gate lead line 1011 or the terminal metal 1012.

A gate insulating film 102 is formed of SiN so as to cover the gate electrode 101. The gate insulating film 102 is formed to cover the outer side of a sealing portion as well in order to protect the terminal portion. A semiconductor layer 103 is formed of an a-Si film on the gate insulating film 102 at a location opposite to the gate electrode 101. The a-Si film forms the channel portion of a TFT, and a drain electrode 104 and a source electrode 105 are formed on the a-Si film as the channel portion is sandwiched between the drain electrode 104 and the source electrode 105.

A picture signal line also serves as the drain electrode 104, and the source electrode 105 is connected to the pixel electrode 110. The drain electrode 104 is formed also simultaneously with the source electrode 105 in the same layer. In FIG. 9, the drain electrode 104 and the source electrode 105 are depicted in a single layer. However, in the embodiment, the structure of the drain electrode 104 and the source electrode 105 is a three-layer structure in which a cap layer is provided on an Al alloy layer and a base layer is provided below the Al alloy layer as the Al alloy layer is sandwiched between the cap layer and the base layer. It is noted that the drain electrode 104, the source electrode 105, the picture signal line, or the like is sometimes in a two-layer structure of an Al alloy layer and a cap layer. Alternatively, the picture signal line or the like is sometimes in a single layer. In this case, for example, an MoCr alloy, an MoW alloy, or the like is used.

There is sometimes the case where the picture signal line or the like extends near the end of the TFT substrate 100 through the sealing portion to form a drain lead line and a terminal metal. A terminal in this case is referred to as a drain terminal.

An inorganic passivation film 106 is formed of SiN so as to cover the TFT. The inorganic passivation film 106 particularly protects the channel portion of the TFT from an impurity 401. The inorganic passivation film 106 extends to the outer side of the sealing portion for protecting the terminal portion 120, and protects a lead line 1041, the terminal metal 1012, and the like.

An organic passivation film 107 is formed on the inorganic passivation film 106. Since the organic passivation film 107 serves to protect the TFT and simultaneously planarize the surface, the organic passivation film 107 is formed thickly. The thickness ranges from 1 to 4 μm. The organic passivation film is formed of a photosensitive resin, and can be patterned with no resist.

The common electrode 108 is formed on the organic passivation film 107. The common electrode 108 is formed by sputtering ITO that is a transparent conductive film on the entire display region. After forming the common electrode 108 on throughout the surface by sputtering, the common electrode 108 is removed by etching for forming a through hole 111 that conducts electricity between the pixel electrode 110 and the source electrode 105.

The interlayer insulating film 109 is formed of SiN so as to cover the common electrode 108. After forming the interlayer insulating film 109, the through hole 111 is formed by etching. The inorganic passivation film 106 is etched using the interlayer insulating film 109 as a resist to form the through hole ill. After that, ITO is formed by sputtering. The ITO becomes the pixel electrode 110 so as to cover the interlayer insulating film 109 and the through hole ill. The sputtered ITO is patterned to form the pixel electrode 110. The ITO to be the pixel electrode 110 is also provided on the through hole 111. The source electrode 105 and the pixel electrode 110 extending from the TFT conduct electricity in the through hole 111, and a picture signal is supplied to the pixel electrode 110.

An alignment layer 113 is formed on the pixel electrode 110 for aligning the liquid crystal molecules 301. In FIG. 9, a counter substrate 200 is disposed as the liquid crystal layer 300 is sandwiched between the counter substrate 200 and the TFT substrate 100. Color filters 201 are formed for color display on the inner side of the counter substrate 200, and a black matrix 202 is formed between the color filters 201. The black matrix 202 is provided to improve contrast, and also serves as a light shielding film for the TFT. An overcoat film 203 is formed so as to cover the color filters 201 and the black matrix 202. The overcoat film 203 is provided to relax roughness on the surface. An alignment layer 113 is formed on the overcoat film 203 for determining the initial alignment of liquid crystals.

On the contrary to the configuration described hereinabove, in the IPS liquid crystal display device, there is sometimes such a configuration in which a comb tooth common electrode 108 is formed on the pixel electrode 110 solidly applied in the plane as the interlayer insulating film 109 is sandwiched between the comb tooth common electrode 108 and the pixel electrode 110. Also in this case, ITO formed on the terminal portion is similarly provided, and only the name is different, so that a description will be made based on the structure described in FIG. 9 in the following description.

Figure 10:
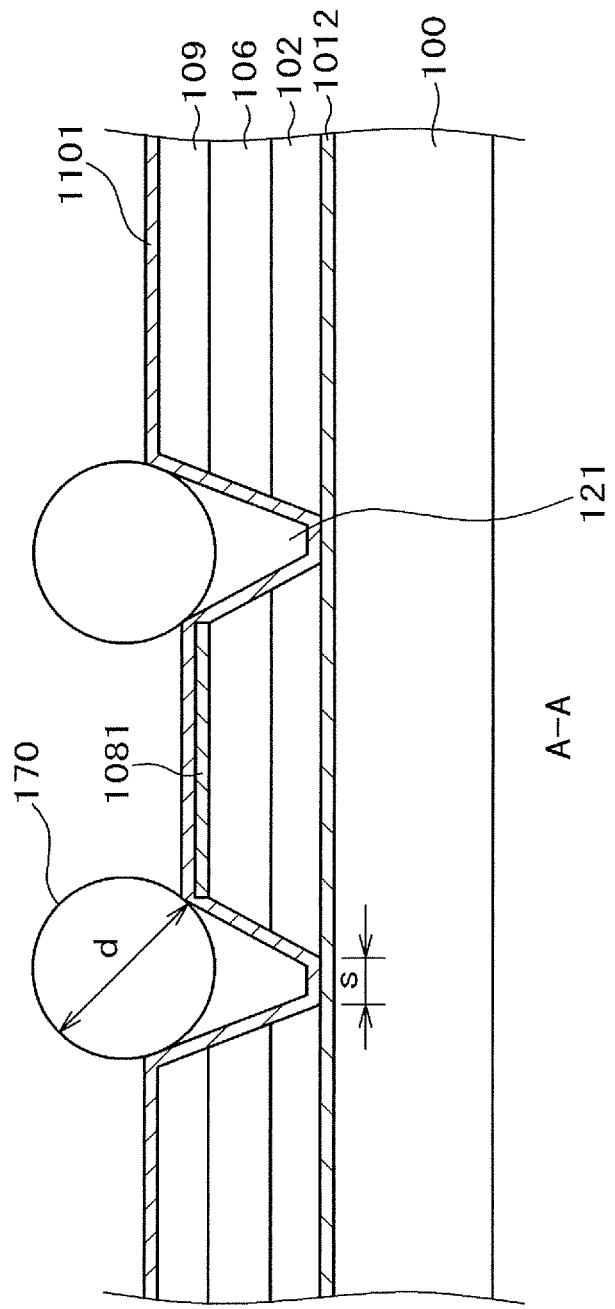
FIG. 10 is a plan view of terminal portions according to a first example of the second embodiment.

FIG. 10 is a cross sectional view of a first example of the embodiment. A plan view of a terminal portion of the first example of the embodiment is the same as in FIG. 3. FIG. 10 is a cross sectional view of the example corresponding to a cross section along the line A-A in FIG. 3. In FIG. 10, the terminal metal 1012 that the width of the gate lead line 1011 is widened is formed on the TFT substrate 100. The gate insulating film 102 is stacked on the terminal metal 1012, the inorganic passivation film 106 is stacked on the gate insulating film 102, and the interlayer insulating film 109 is stacked on the inorganic passivation film 106. The organic passivation film 107 shown in FIG. 9 is not formed. The organic passivation film 107 is formed only on the inner side of a sealing material 150 in FIG. 1.

In FIG. 10, the interlayer insulating film 109, the inorganic passivation film 106, and the gate insulating film 102 are etched together to form a contact hole 121. The entire terminal portion on the films is covered with a pixel electrode ITO 1101 formed simultaneously with the pixel electrode. In FIG. 10, on the center part of the contact hole 121, an island region is formed, in which the gate insulating film 102, the inorganic passivation film 106, and a common electrode ITO 1081 are stacked on each other and the pixel electrode ITO 1101 is formed on the stacked films.

The following is processes for forming such a structure. Namely, as similar to the display region shown in FIG. 9, the gate insulating film 102 and the inorganic passivation film 106 are formed as stacked on each other. After the forming, the organic passivation film 107 formed on the display region is removed on the outer side of the sealing material 150. After the removal, the common electrode ITO 1081 is partially left on the inorganic passivation film 106 of the terminal portion when forming the common electrode 108 with ITO.

After the forming, in order to form the contact hole 121 on the terminal portion, the interlayer insulating film 109, the inorganic passivation film 106, and the gate insulating film 102 are etched together. At this time, the portion where the common electrode ITO 1081 is left becomes a resist, and the inorganic passivation film 106 and the gate insulating film 102 below the common electrode ITO 1081 are not etched, and left in an island shape.

Thus, the portion where the pixel electrode ITO 1101 is actually connected to the terminal metal 1012 is only a region in a width s in FIG. 10. The region in the width s is formed so as to surround the island region as shown in FIG. 3. In the case where an IC is connected to such a terminal portion using an ACF, conductive particles 170 dispersed in resin conduct electricity. A diameter d of the conductive particle 170 is made wider than the width s of the lower part of the through hole 121, so that such an event can be prevented that the conductive particle 170 contacts the bottom face of the through hole 121. The effect of the example exerted by such a configuration is the same as the effect described in FIG. 4, and the description is omitted.

Figure 11:
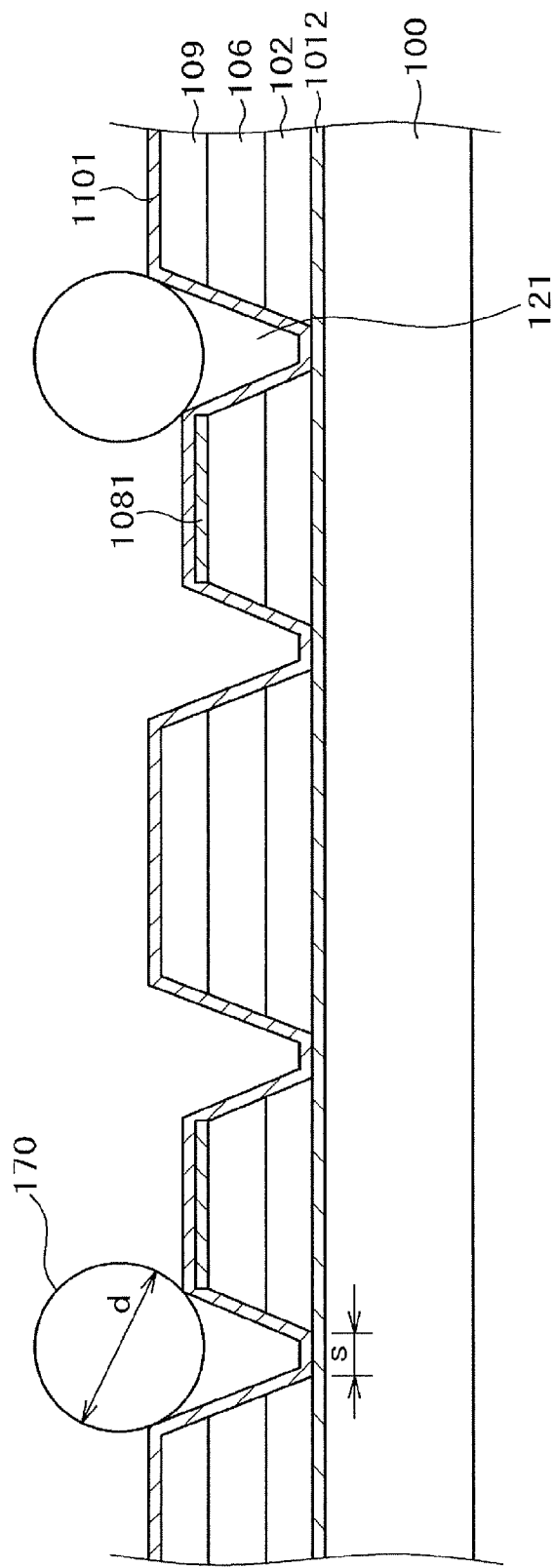
FIG. 11 is a plan view of terminal portions according to a second example of the second embodiment.

FIG. 11 is a cross sectional view of a second example of the embodiment. A plan view of a terminal portion of the second example of the embodiment is the same as in FIG. 5. FIG. 11 is a cross sectional view of the example corresponding to a cross section along a line B-B in FIG. 5. The configuration in FIG. 11 is the same as the configuration in FIG. 10, except that two contact holes 121 are formed on the terminal portion. Namely, also in the example, since the conductive particle 170 does not contact the portion where the terminal metal 1012 and the pixel electrode ITO 1101 are stacked on each other, flaws or cracks do not occur on the terminal metal 1012 or the pixel electrode ITO 1101 on the portion. Accordingly, such an event can be prevented that the terminal metal 1012 is corroded or oxidized, and the reliability of connection can be maintained.

Moreover, according to the example, the fact that the contact resistance of the terminal portion 120 can be reduced because two through holes 121 exist is the same as the second example of the first embodiment. FIGS. 5 and 11 show examples that the contact hole 121 is formed at two locations. However, two or more of the contact holes 121 can also be formed depending on the size of the terminal portion.

Figure 12:
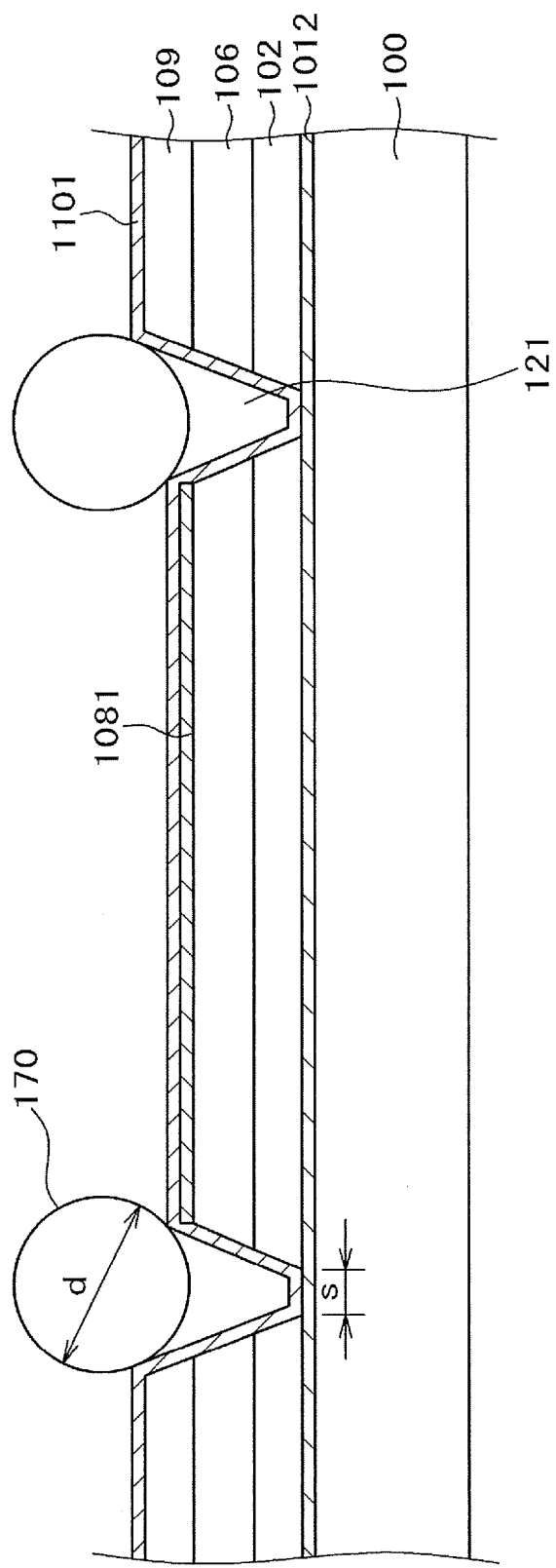
FIG. 12 is a plan view of terminal portions according to a third example of the second embodiment.

FIG. 12 is a cross sectional view of a third example of the embodiment. A plan view of a terminal portion of the third example of the embodiment is the same as in FIG. 7. FIG. 12 is a cross sectional view of the example corresponding to a cross section along a line C-C in FIG. 7. The configuration in FIG. 12 is the same as the first example of the embodiment, except that a tall through hole 121 is formed on the terminal portion and a tall island region is formed in the terminal portion.

Namely, also in the example, since the conductive particle 170 does not contact the portion where the terminal metal 1012 and the pixel electrode ITO 1101 are stacked on each other, flaws or cracks do not occur on the terminal metal 1012 or the pixel electrode ITO 1101 on the portion. Accordingly, such an event can be prevented that the terminal metal 1012 is corroded or oxidized, so that the reliability of connection can be maintained.

In the example, the length of the contact hole 121 is increased, and the area of the contact hole 121 can be increased, so that the contact resistance of the terminal portion 120 can be made smaller.

Figure 13:
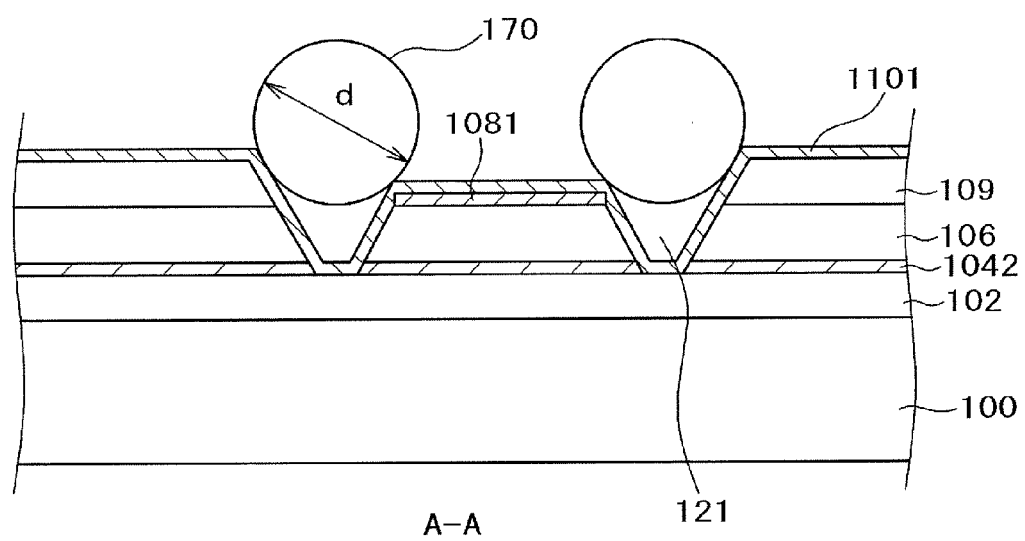
FIG. 13 is a plan view of terminal portions according to a fourth form of the second embodiment.
Figure 14:
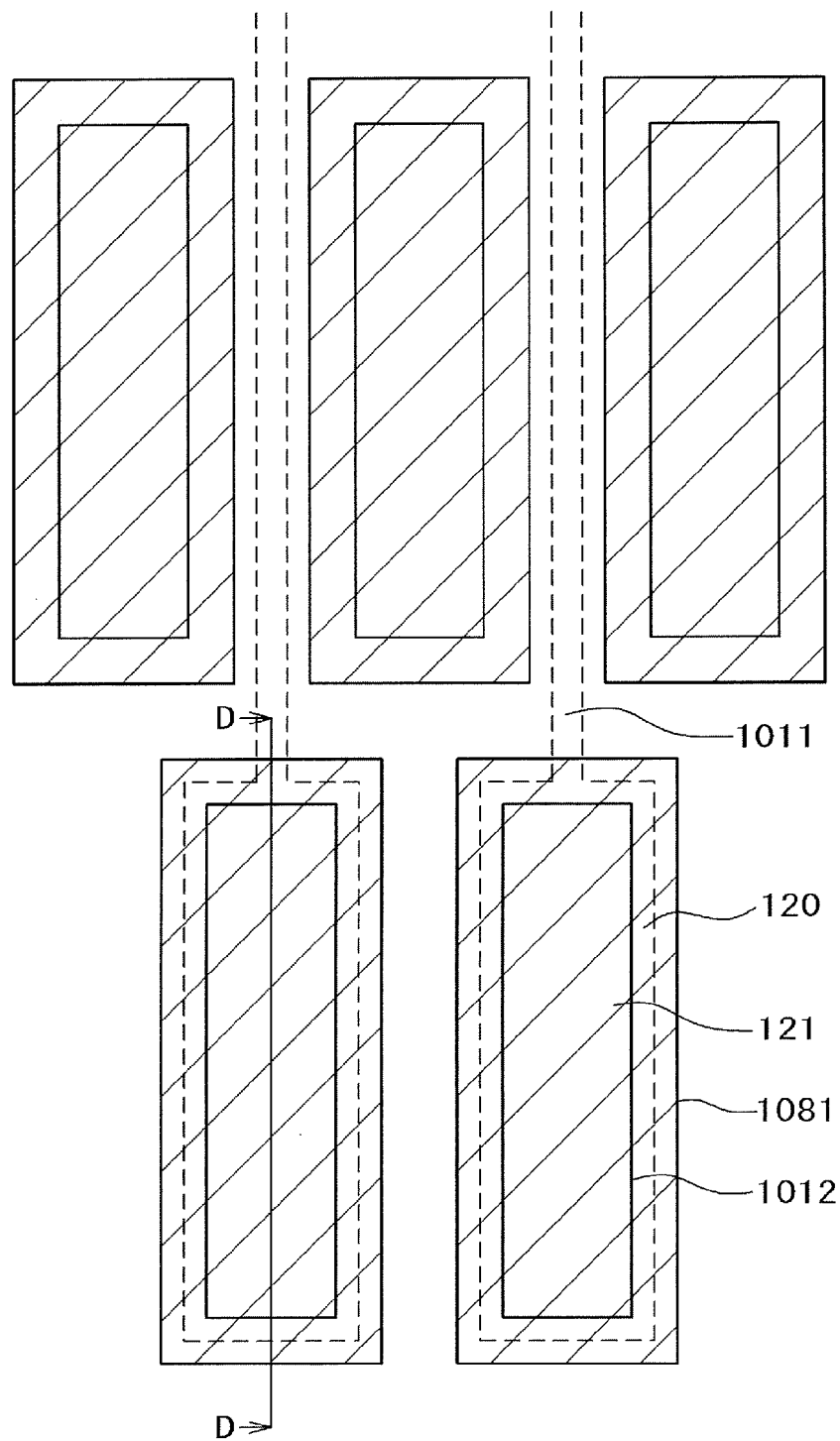
FIG. 14 is a plan view of terminal portions according to a conventional example.
Figure 15:
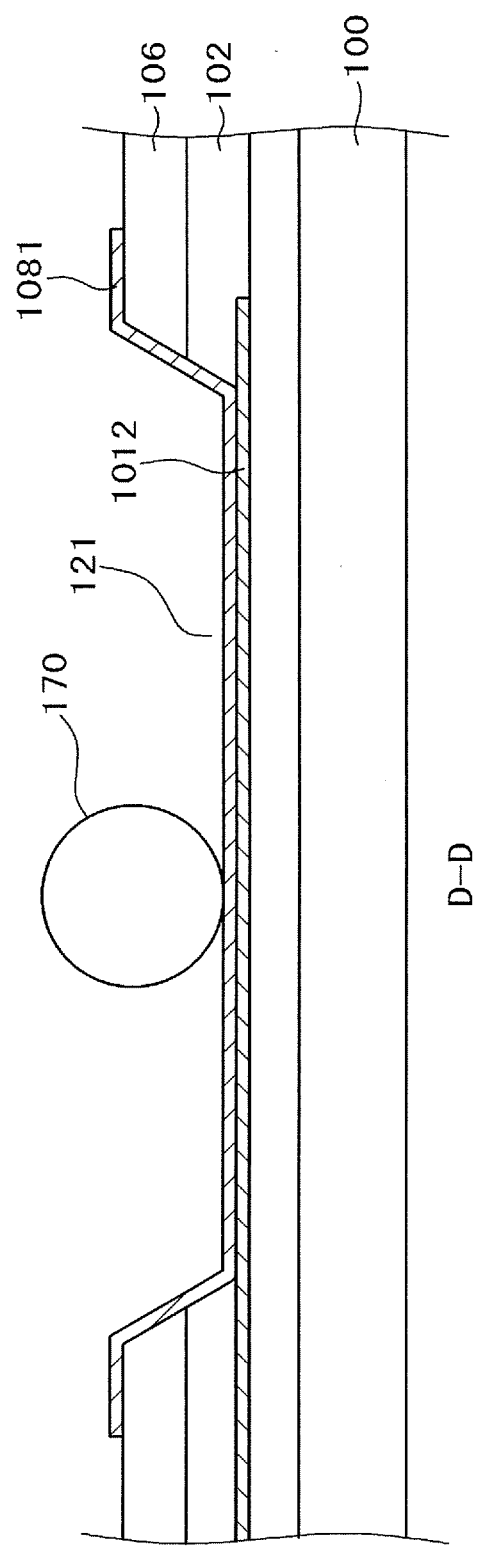
FIG. 15 is a cross sectional view along a line D-D in FIG. 14.

FIG. 13 is a cross sectional view of a fourth example of the present invention in the case where the drain lead line is used for the terminal metal. A plan view of the example is the same as in FIG. 3, and FIG. 13 is a cross sectional view corresponding to a cross section along the line A-A in FIG. 3. In FIG. 13, the gate insulating film 102 is formed on the TFT substrate 100, and a drain terminal metal 1042 that the width of the drain lead line is widened is formed on the gate insulating film 102. In the example, the drain terminal metal 1042 in this case is in a three-layer structure in which a cap layer is provided on an Al alloy layer and a base layer is provided below the Al alloy layer as the Al alloy layer is sandwiched between the cap layer and the base layer. The Al alloy layer is AlNd or an AlCu alloy. The cap layer and the base layer are an MoCr alloy or an MoW alloy.

As described above, in the case where the drain terminal metal 1042 includes Al, when flaws or cracks, for example, occur on the pixel electrode ITO 1101 or the like covering the drain terminal metal 1042, moisture or oxygen enters from the flaws or cracks, an Al alloy is corroded, and connection failure occurs on the terminal portion 120.

In the example, an island region is formed in the through hole 121 to reduce the diameter s of the portion where the drain terminal metal 1042 and the pixel electrode ITO 1101 are stacked on each other, so that the conductive particle 170 is prevented from contacting the portion where the drain terminal metal 1042 and the pixel electrode ITO 1101 are stacked on each other, and flaws or cracks are prevented from occurring on the drain terminal metal 1042 and ITO on the drain terminal metal 1042. Accordingly, the drain terminal metal 1042 can be prevented from being corroded or oxidized, and the reliability of the terminal portion 120 can be secured.

In addition to this, the terminal structure using the drain lead line includes the configuration like the structure in FIG. 5 or FIG. 7 as a plan view. Such a configuration is the same as in FIG. 11 and FIG. 12, except that the drain terminal metal 1042 that the drain lead line is widened is formed on the gate insulating film 102 in the cross sectional views in FIGS. 11 and 12, and the description is omitted.

In the description above, the description is made that the terminal is an IC terminal. However, the terminal is also similarly applicable in the case of a flexible wiring board terminal.

What is claimed is:

1. A liquid crystal display device comprising:
   A TFT substrate including a terminal region and a display region on which a TFT and a pixel electrode are formed in a matrix arrangement, and a terminal formed in the terminal region on the TFT substrate, the terminal including:
   a first insulating film and a second insulating film formed on a terminal metal formed on the terminal region;
   a contact hole formed in the first insulating film and the second insulating film; and
   a first ITO formed in the contact hole and on the second insulating film, the terminal being connected to a different circuit through an anisotropic conductive film (ACF) including a conductive particle of a diameter d, wherein the first insulating film having an island region in the contact hole, wherein a second ITO is formed on the island region and formed between the island region and the first ITO, a portion where the terminal metal contacts the first ITO in the contact hole is formed to surround the island region, the portion having a width s, and the width s is smaller than the diameter d, the second ITO does not contact the terminal metal in the portion, and the second insulating film is not formed on the island region.

2. The liquid crystal display device according to claim 1, wherein the liquid crystal display device is a liquid crystal display device according to an IPS mode;

the terminal metal is formed simultaneously with a gate electrode;

the first insulating film is a gate insulating film;

the second insulating film is an inorganic passivation film;

the first ITO is formed simultaneously with a common electrode; and the second ITO is formed simultaneously with the pixel electrode.

3. The liquid crystal display device according to claim 2, wherein a plurality of the contact holes are formed on the terminal metal.

* * * * *